United States Patent
Unno et al.

[11] Patent Number: 5,953,106
[45] Date of Patent: Sep. 14, 1999

[54] PROJECTION OPTICAL SYSTEM, EXPOSURE APPARATUS AND SEMICONDUCTOR-DEVICE MANUFACTURING METHOD USING THE SYSTEM

[75] Inventors: Yasuyuki Unno, Hadano; Seiji Orii; Masami Yonekawa, both of Yokohama, all of Japan

[73] Assignee: Canon Kabushiki Kaisha, Tokyo, Japan

[21] Appl. No.: 08/904,453

[22] Filed: Jul. 31, 1997

Related U.S. Application Data

[63] Continuation of application No. 08/412,103, Mar. 28, 1995, abandoned, which is a continuation of application No. 07/970,032, Nov. 2, 1992, abandoned.

[30] Foreign Application Priority Data

Nov. 22, 1991 [JP] Japan ................................. 3-334438

[51] Int. Cl.[6] .......................... G03B 27/52; G03B 27/42; G01J 1/24
[52] U.S. Cl. ........................... 355/55; 355/53; 250/370.15
[58] Field of Search ................................. 355/53, 50, 55, 355/67, 77, 30; 250/370.08, 370.15, 492.2, 492.22, 548

[56] References Cited

U.S. PATENT DOCUMENTS

| | | | |
|---|---|---|---|
| 4,825,247 | 4/1989 | Kemi et al. | 355/55 |
| 4,920,505 | 4/1990 | Suzuki | 364/525 |
| 4,998,821 | 3/1991 | Ohta et al. | 353/122 |
| 5,137,349 | 8/1992 | Taniguchi | 355/55 |
| 5,337,097 | 8/1994 | Suzuki et al. | 353/101 |

*Primary Examiner*—Eddie C. Lee
*Assistant Examiner*—Hung Henry Nguyen
*Attorney, Agent, or Firm*—Fitzpatrick, Cella, Harper & Scinto

[57] ABSTRACT

A projection optical apparatus includes a projection optical system including lenses, a measurement unit for measuring a change in the shape of one of the lenses, and an adjustment unit for adjusting the optical characteristics of the projection optical system in accordance with a signal from the measurement unit. Since a change in the shape of the lens due to a thermal change of the lens is directly measured and optical characteristics of the projection optical system are adjusted in accordance with the result of the measurement, projection can be performed with high stability and precision.

56 Claims, 7 Drawing Sheets

FLOW FOR MANUFACTURING
SEMICONDUCTOR DEVICES

WAFER PROCESS

PROJECTION OPTICAL SYSTEM, EXPOSURE APPARATUS AND SEMICONDUCTOR-DEVICE MANUFACTURING METHOD USING THE SYSTEM

This application is a continuation of application Ser. No. 08/412,103, filed Mar. 28, 1995, which is a continuation of application Ser. No. 07/970,032 filed Nov. 2, 1992, now abandoned.

BACKGROUND OF THE INVENTION

1. Field of the Invention

This invention relates to a projection exposure apparatus and a semiconductor-device manufacturing method which uses the apparatus, and more particularly, to an apparatus and a method in which an electronic circuit pattern on a reticle is projected onto a wafer by a projection optical system (a projection lens) in a process for manufacturing semiconductor devices, such as IC's (integrated circuits), LSI's (large-scale integrated circuits), or the like. Adjustments are made to compensate for a change in the optical performance of a lens in the projection optical system due to a change in the optical characteristics of the lens caused by a temperature increase of the lens resulting from absorption of exposure light, whereby a precise projecion pattern image can be obtained.

2. Description of the Background Art

Projection exposure apparatuses (steppers) in which high resolution and high throughput can be relatively easily obtained have been generally used for manufacturing semiconductor devices, such as IC's, LSI's or the like. Such a projection exposure apparatus does not use a batch exposure method in which a pattern image is formed on the entire surface of a wafer by a single exposing operation, but instead uses a so-called step-and-repeat exposure method in which regions are sequentially exposed by moving the wafer after each single exposing operation has been completed, and images of the same pattern are thereby formed on the entire surface of the wafer by repeating the exposing operation a plurality of times.

During the exposure operation, a projection optical system projects a reduced image of an electronic circuit pattern which is formed on the surface of a reticle onto the surface of the wafer with a predetermined projection magnification of, for example, ⅕ or ¹⁄₁₀. In recent projection exposure apparatuses, in response to a tendency toward high integration of semiconductor devices, there has been an effort to reduce the wavelength of exposure light, and to increase the NA (numerical aperture) of the projection optical system of the apparatus.

In general, if the NA of the projection optical system is intended to increase, the depth of the focus of the system is reduced. However, in order to provide a fine circuit pattern, it is necessary to precisely align a reticle with a wafer.

In particular, if the integration of semiconductor devices in a projection exposure apparatus is to be increased, the following problems arise in the projection optical system of the apparatus.

(a) A change in the focus position of the projection optical system.

Lenses constituting the projection optical system of the apparatus absorb part of the exposure light which causes a thermal change, whereby the focus position changes over a period of time, for example, as shown in FIG. 7. FIG. 9 shows a state in which a light beam 51 indicated by solid lines changes to a light beam 52 indicated by broken lines during an exposure process, whereby the focus position changes.

In general, as shown in FIG. 7, the amount of change of the focus position increases with the lapse of time after the start of exposure, and reaches a steady state at time t1. If the exposure is terminated at time t2, the amount of change of the focus position decreases with the lapse of time, and finally returns to the initial state at time t3. A change in the focus position causes no problem if the amount of the change is small. However, the amount of the change which exceeds the range of the depth of the focus of the projection optical system causes a great problem.

(b) A change in the imaging magnification of the projection optical system.

The lenses constituting the projection optical system of the apparatus absorb part of the exposure light which causes a thermal change, whereby the imaging magnification changes over a period of time, for example, as shown in FIG. 8. FIG. 10 shows a state in which a pattern 53 indicated by solid lines changes to a pattern 54 indicated by broken lines, that is, the imaging magnification changes over a period of time.

In general, as shown in FIG. 8, if exposure is started at time t0, the amount of change of the imaging magnification increases with the lapse of time, and reaches a steady state at time t1. If the exposure is terminated at time t2, the amount of change of the imaging magnification decreases with the lapse of time, and finally returns to the initial state at time t3. Such a change in the imaging magnification directly influences an alignment error of a circuit pattern, causing a great problem when a fine circuit pattern is being printed.

Conventionally, regarding the problem of a change in the focus position described in item (a), the change in the focus position is corrected by adjusting the distance between a wafer and the projection optical system in accordance with the change in focus position by moving a wafer stage which contains the wafer along the direction of the optical axis of the projection optical system.

Regarding the problem of a change in the imaging magnification described in item (b), the change in the imaging magnification is corrected by forming an enclosed space in an interval between lenses, and adjusting the air pressure of the enclosed space in accordance with the change in the imaging magnification.

In another approach, the interval between a reticle and a projection lens, or the interval between respective lenses constituting the projection lens, is adjusted in accordance with a change in the imaging magnification.

In a conventional projection exposure apparatus, changes in the focus position and the imaging magnification of the projection optical system of the apparatus are corrected according to the following processes.

Before an actual pattern printing (pattern projection and exposure) operation, measurements are taken to determine how the optical characteristics of the system, i.e., the focus position and the imaging magnification, change with the lapse of time after the start of exposure. Data obtained by sampling the measured data at several points in time, or by approximating the measured data with a certain function, are stored in memory means.

When a pattern printing operation is actually performed, the necessary amounts of correction of the focus position and the imaging magnification over a period of time are calculated using the data from the memory means in accordance with the lapse of time after the start of exposure, whereby the focus position and the imaging magnification are corrected.

Such an approach, however, has the problem that a correction error occurs if conditions when the correction data are obtained and stored in the memory means differ from actual pattern printing conditions. For example, if a difference is present in the intensity of exposure light or in the transmittance of exposure light for the reticle, such a difference causes a correction error.

In another approach, a temperature change in the projection optical system is measured by a temperature sensor, and changes in the optical characteristics of the system are corrected utilizing an output signal from the temperature sensor. In such an approach, however, changes in the optical characteristics of the projection optical system are indirectly estimated from the temperature change, and therefore, the obtained results are not reliable.

SUMMARY OF THE INVENTION

The present invention has been made in consideration of the above-described problems in the prior art.

It is an object of the present invention to provide a projection optical apparatus which can perform highly precise projection without being influenced by a thermal change in the lenses of the projection optical system of the apparatus.

It is another object of the present invention to provide a projection optical apparatus and a semiconductor-device manufacturing method suitable for manufacturing semiconductor devices in which a pattern on an original can be exposed and transferred onto a substrate with high precision.

According to a first aspect of the present invention, a projection optical apparatus is provided which includes a projection optical system having adjustable optical characteristics and a lens having a variable shape. Measurement means measures a change in the shape of the lens and outputs a signal, and adjustment means receives the signal from the measurement means and adjusts the optical characteristics of the projection optical system in accordance with the signal.

According to another aspect of the present invention, a projection exposure apparatus is provided for transferring a pattern on an original onto a substrate and includes exposure means for exposing the original with exposure light and a projection optical system for projecting the pattern on the original onto the substrate using the exposure light to expose and transfer the pattern. The projection optical system has adjustable optical characteristics and a lens having a variable shape. Measurement means measures a change in the shape of the lens and outputs a signal, and adjustment means receives the signal and adjust the optical characteristics of the projection optical system in accordance with the signal.

According to another aspect of the present invention, a method of manufacturing semiconductor devices using a reticle and a wafer is provided. A circuit pattern on the reticle is exposed and transferred onto the wafer using a projection optical system having adjustable optical characteristics and a lens having a variable shape. A change in the shape of the lens is measured and the optical characteristics of the projection optical system are adjusted in accordance with a result of the measurement.

These and other objects, advantages and features of the present invention will become more apparent from the following description of the preferred embodiments taken in conjunction with the accompanying drawings.

DESCRIPTION OF THE PREFERRED EMBODIMENTS

Figure 1:
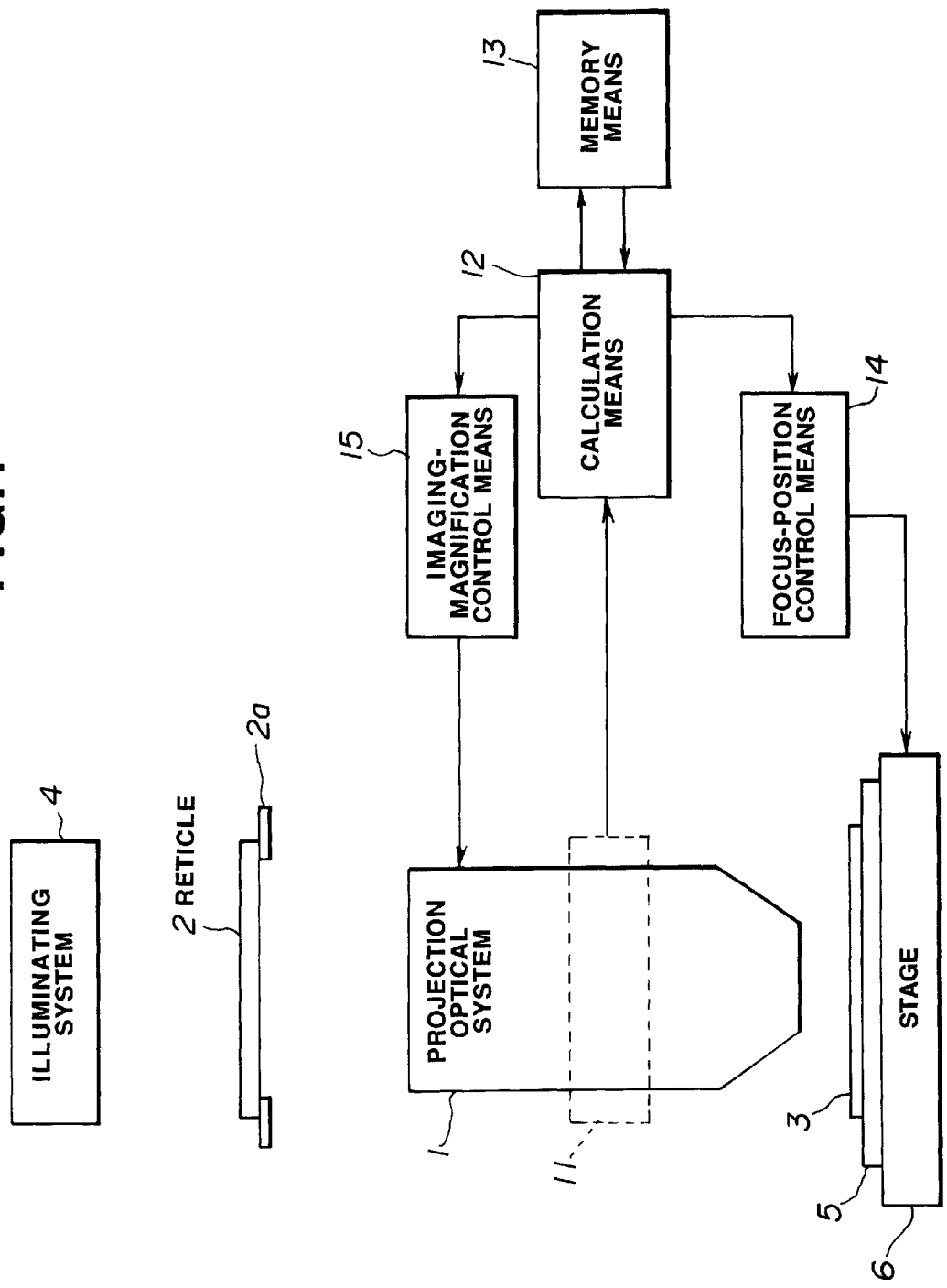
FIG. 1 is a diagram showing the schematic configuration of an apparatus according to a first preferred embodiment of the present invention.

FIG. 1 is a diagram showing the schematic configuration of an apparatus according to a first preferred embodiment of the present invention. In FIG. 1, an electronic circuit pattern is formed on the surface of a reticle (an original) 2. A reticle chuck 2a holds the reticle 2 by suction. An illuminating system 4 includes, for example, an excimer laser, an extra-high pressure mercury lamp, or the like, as a light source means, and illuminates the electronic circuit pattern on the surface of the reticle 2 by exposure light with a uniform illuminance distribution.

A projection optical system (projection lens system) 1 projects the electronic circuit pattern on the surface of the reticle 2 illuminated by the exposure light from the illuminating system 4 onto the surface of a wafer 3 with a predetermined magnification (for example ⅕ or ¹⁄₁₀).

A photosensitive material, such as a resist or the like, is coated on the surface of the wafer 3. A wafer chuck 5 holds the wafer 3 by suction. A wafer stage 6 drives the wafer chuck 5 along a predetermined surface (the XY plane).

In FIG. 1, after aligning the reticle 2 with the wafer 3 so as to be in a predetermined relationship, the electronic circuit pattern on the surface of the reticle 3 is projected and exposed onto a region of the surface of the wafer 3 by opening and closing a shutter means (not shown). Subsequently, a step-and-repeat method is performed in which the pattern is sequentially projected and exposed onto other regions of the surface of the wafer 3 by shifting the wafer 3 within the XY plane by a predetermined amount.

The projection optical system 1 in the present embodiment includes a plurality of lenses, each of which is held by a holding member and a presser ring, and which are accommodated within a lens barrel while forming at least one enclosed space.

A shape measuring means 11 (a thermal expansion measuring unit of a lens) measures information relating to a thermal change in one of the lenses consituting the projection optical system 1, for example, a change in the shape of the lens due to thermal expansion caused by absorption of the exposure light. A memory means 13 stores data relating to the changes in the optical characteristics of the projection optical system 1 due to a thermal change of the lens, such as the amounts of change of the focus position and the imaging magnification, and the like. A calculation means 12 uses the data stored in the memory means 13 to obtain the amounts of change of the focus position and the image magnification of the projection optical system 1 in accordance with a signal representing the amount of thermal expansion of the lens obtained by the shape measuring means 11. A focus-position control means 14 corrects a change in the focus position of the projection optical system 1 by moving the wafer stage 6 along the direction of the optical axis of the projection optical system 1 in accordance with a signal from the calculation means 12. An image-magnification control means 15 corrects a change in the imaging magnification of the projection optical system 1 by adjusting the air pressure of the enclosed space provided in a portion of the projection optical system 1 in accordance with a signal from the calculation means 12. In the present embodiment, the calculation means 12, the focus-position control means 14 and the imaging-magnification control means 15 constitute elements of an adjusting system.

In the present embodiment, after the start of actual exposure, the calculation means 12 reads necessary data from the memory means 13 in accordance with a signal representing the amount of thermal expansion input from the shape measuring means 11, and calculates the amounts of correction for changes in the focus position and the imaging magnification of the projection optical system 1 corresponding to the input amount of thermal expansion. The calculated amounts of correction are transmitted to the focus-position control means 14 and the imaging-magnification control means 15 as control signals for correcting the focus position and the imaging magnification, respectively.

The focus-position control means 14 corrects the amount of change of the focus position by moving the wafer stage 6, and the imaging-magnification control means 15 corrects the amount of change of the imaging magnification by changing the air pressure of the enclosed space between the lenses. Thus, the projection optical system 1 projects and exposes the pattern which is formed on the surface of the reticle 2 onto the surface of the wafer 3 while maintaining high resolution, facilitating the production of highly-integrated semiconductor devices.

Figure 2:
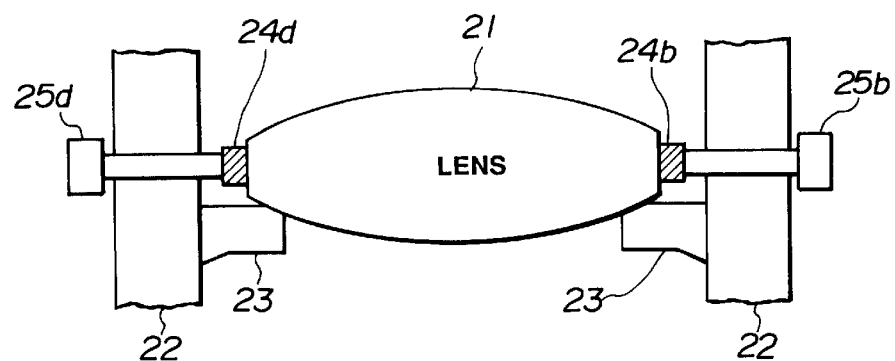
FIG. 2 is a cross-sectional view of a principal portion of a shape-measuring means of the apparatus shown in FIG. 1.
Figure 3:
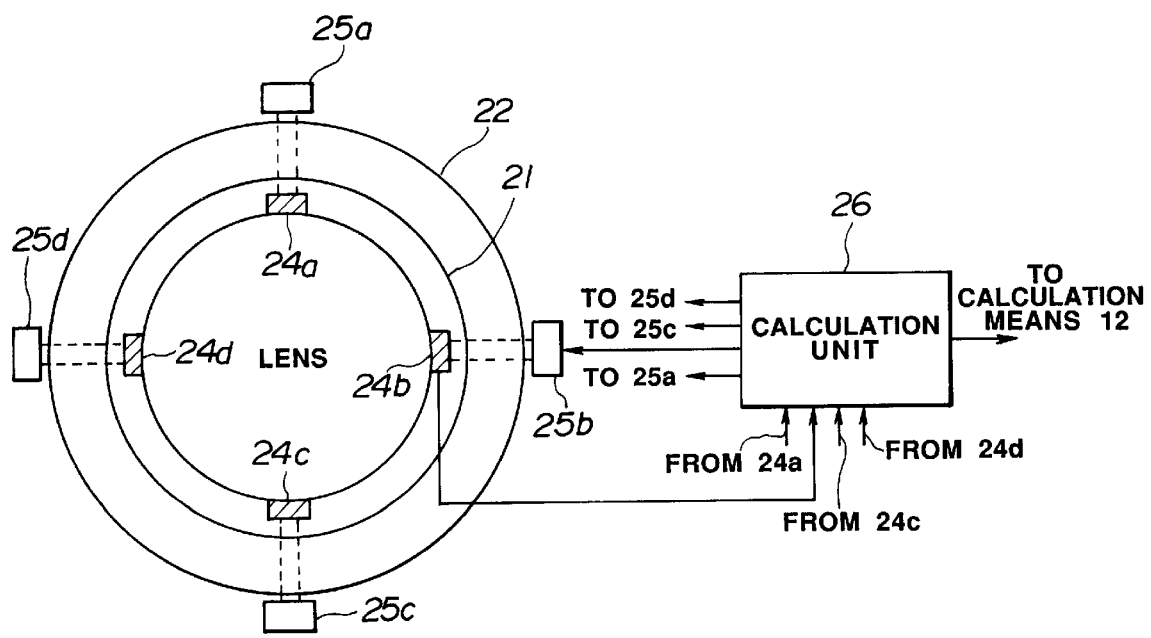
FIG. 3 is a diagram illustrating the schematic configuration of a principal portion of the apparatus shown in FIG. 1 including the shape-measuring means.

Next, a description will be provided of the configuration and the operation of the shape measuring means 11 in the present embodiment with reference to FIGS. 2 and 3. FIG. 2 is a cross-sectional view of a principal portion of the shape measuring means 11. FIG. 3 is a diagram showing the schematic configuration of a principal portion of the apparatus including the shape measuring means 11.

In FIGS. 2 and 3, a lens 21 is one of the plurality of lenses constituting the projection optical system 1. A lens barrel 22 accommodates the lens 21. A lens supporting unit 23 is fixed to the lens barrel 22, and supports the lens 21. Pressure sensors 24a–24d, each of which comprises, for example, a piezoelectric element or the like, measure the amount of change in the shape of the lens 21, that is, the amount of thermal expansion. Sensor position adjusting mechanisms 25a–25d perform fine adjustment of the positions of the pressure sensors 24a–24d so that the output values from the pressure sensors 24a–24d become appropriate values, respectively.

The pressure sensors 24a–24d and the sensor position adjusting mechanisms 25a–25d constitute elements of the shape measuring means 11 for measuring a change in the shape of the lens due to thermal expansion. A calculation unit 26 inputs values output from the pressure sensors 24a–24d, and controls the sensor position adjusting mechanisms 25a–25d so that the above-described output values become appropriate values. After the output values have been adjusted to appropriate values, the calculation unit 26 calculates the amount of thermal expansion of the lens 21 from the output values, and outputs the calculated amount as an input signal to the calculation means 12 shown in FIG. 1.

In the present embodiment, if the temperature of the lens 21 rises by absorbing part of the exposure light, the lens 21 tends to expand in the direction along its optical axis and in the radial direction. At that time, output signals corresponding to thermal expansion are obtained from the pressure sensors 24a–24d in close contact with the outer circumference of the lens 21, and are input to the calculation unit 26.

If the pressure sensors 24a–24d are not provided at appropriate positions, problems arise such that output signals may not be obtained even if the lens 21 expands in the radial direction due to absorption of the exposure light, or signals may be output although exposure has not yet been performed and the lens 21 has not actually expanded. Accordingly, the calculation unit 26 adjusts the positions of the pressure sensors 24a–24d by controlling the position adjusting mechanisms 25a–25d so that the output signals become zero before the lens 21 expands and have appropriate values corresponding to the amount of expansion after the start of expansion.

As described above, output signals from the pressure sensors 24a–24d whose positions have been adjusted are input to the calculation unit 26, which performs operations, such as amplification, averaging and the like, of the four signals from the pressure sensors 24a–24d, and outputs the resultant signal as an input signal to the calculation means 12. The amount of thermal expansion of the lens 21, and the amount of temperature rise by absorption of the exposure light by the lens 21 are substantially proportional. Hence, information relating to the amount of temperature rise of the lens 21 is input to the calculation means 12 by the above-described processing.

Next, a description will be provided of the operation of the entire projection exposure apparatus of the present embodiment, and a method of manufacturing semiconductor devices using the apparatus.

The exposure light projected from the illuminating system 4 shown in FIG. 1 uniformly illuminates the surface of the reticle 2. Part of the exposure light which illuminates a portion of the surface of the reticle 2 where the circuit pattern is formed is transmitted through the reticle 2, and another part of the exposure light is reflected by the reticle 2. The projection optical system 1 projects the pattern which is formed on the surface of the reticle 2 onto the surface of the wafer 3 using the transmitted exposure light while reducing the size of the pattern in a predetermined reduction ratio (usually, $\frac{1}{5}$ or $\frac{1}{10}$).

A resist which chemically changes its properties with exposure to light is uniformly coated on the surface of the wafer 3. The transmitted exposure light causes a chemical change in portions of the resist irradiated by the exposure light, whereby the circuit pattern which is formed on the surface of the reticle 2 is transferred onto the surface of the wafer 3 while being reduced with the predetermined reduction ratio. By repeating such projection and exposure, predetermined patterns are successively formed on the surface of the wafer 3. Thereafter, predetermined developing processing is performed to manufacture semiconductor devices.

In the present embodiment, before performing an actual printing operation of a circuit pattern, an operation of experimentally measuring the amounts of change of the focus position and the imaging magnification produced in the projection optical system 1 is performed utilizing a change in the output signal from the the shape measuring means 11.

When exposure light enters the projection optical system 1 from the illuminating system 4, the lenses constituting the projection optical system 1 absorb part of the exposure light. Hence, a predetermined signal is output from the shape measuring means 11, and the focus position and the imaging magnification of the projection optical system 1 change. The output signal from the shape measuring means 11 changes in accordance with the amount of the exposure light, the lapse of time after the start of exposure, or the like, and the amounts of change of the focus position and the imaging magnification of the projection optical system 1 corresponding to the respective values of the output signals are measured.

The measured values are stored in the memory means 13 together with the values of the output signals from the shape measuring means 11. The output signal from the shape measuring means 11 is in a one-to-one relationship with the amounts of change of the focus position and the imaging magnification of the projection optical system 1.

Accordingly, a few relationships between the output signal from the shape measuring means 11, and the amounts of change of the focus position and the imaging magnification of the projection optical system 1 are first obtained within a range of conditions which are considered to be used in an actual circuit-pattern printing operation. Subsequently, the amounts of change of the focus position and the imaging magnification of the projection optical system 1 corresponding to an arbitrary output signal from the shape measuring means 11 are obtained from the above-described data by interpolating the measured data.

In an actual circuit-pattern printing operation, the calculation means 12 reads necessary data from the memory means 13, which stores the above-described data, in accordance with a signal from the shape measuring means 11, and calculates the necessary amounts of correction of the focus position and the imaging magnification of the projection optical system 1 corresponding to the signal. The focus-position control means 14 receives data for the necessary amount of correction of the focus position from the calculation means 12, and corrects a change in the focus position of the projection optical system 1 by moving the wafer stage 5 in the direction along the optical axis.

The imaging-magnification control means 15 receives data for the necessary amount of correction of the imaging magnification from the calculation means 12, and corrects a change in the imaging magnification of the projection optical system 1 by changing the air pressure in the enclosed space provided in the part of the projection optical system 1.

As described above, in the present embodiment, changes in the focus position and the imaging magnification of the projection optical system 1 are corrected in accordance with a signal from the shape measuring means 11, whereby exact correction can be performed even if the exposure conditions and the conditions of the location where the apparatus is placed change.

Although in the present embodiment a description has been provided of the case in which four pressure sensors 24a–24d are used for measuring the amount of thermal expansion of the lens 21 as shown in FIG. 2, the number of pressure sensors may be any number equal to at least one. Although in the present embodiment, a description has been provided of the case in which one convex lens is used as the lens for measuring thermal expansion of the lenses, a concave lens or any other optical member, such as plane-parallel plate glass or the like, may also be used. Furthermore, it is not required to measure only one object, but a plurality of objects may be measured, and the average of measured values may be used.

The sensor for measuring the amount of thermal expansion is not limited to the above-described pressure sensor, but the amount of thermal expansion may be obtained by detecting the amount of minute displacement of the lens using a displacement sensor.

Figure 4:
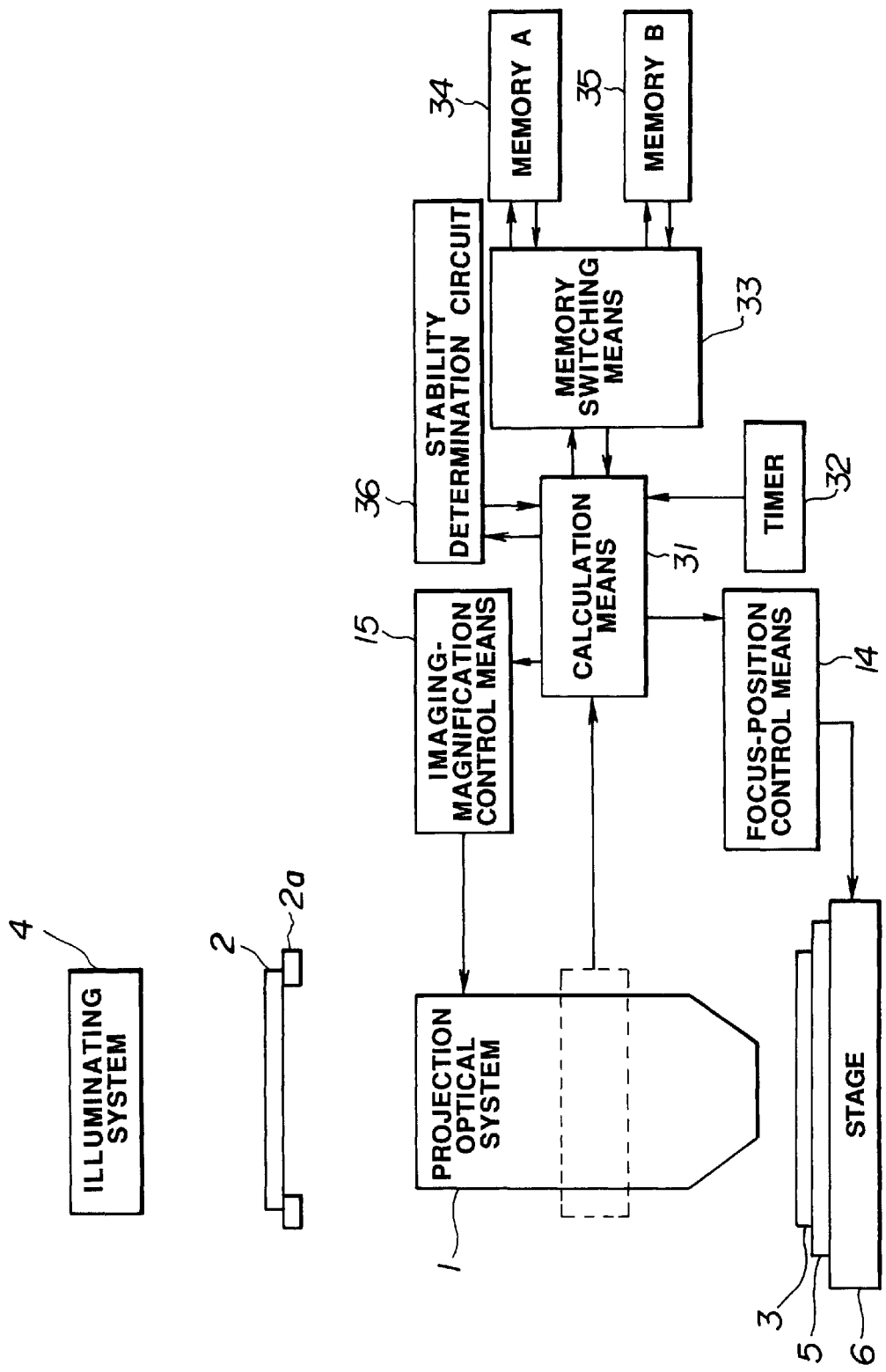
FIG. 4 is a diagram showing the schematic configuration of an apparatus according to a second preferred embodiment of the present invention.

FIG. 4 is a diagram showing the schematic configuration of an apparatus according to a second preferred embodiment of the present invention. In FIG. 4, the same components as those shown in FIG. 1 are indicated by the same reference numerals.

The second embodiment differs from the first embodiment shown in FIG. 1 in the following items.

A calculation means 31 is connected to a timer 32 for measuring the time elapsed after the start of exposure so that the time elapsed after the start of exposure is always input to the calculation means 31. The calculation means 31 is also connected to two kinds of memories, i.e., a memory A 34 and a memory B 35, via a memory switching means 33. The calculation means 31 can selectively read data stored in the memory A 34 or the memory B 35 by controlling the memory switching means 33.

The memory A 34 has previously measured and stored the relationship between the time elapsed after the start of exposure, and the amounts of change of the focus position and the imaging magnification of the projection optical system 1. As in the first embodiment, the memory B 35 has previously measured and stored the relationship between the output signal from the shape measuring means 11, and the amounts of change of the focus position and the imaging magnification of the projection optical system 1.

The second embodiment is substantially the same as the first embodiment except that the calculation means 31 is connected to the memory A 34 and the memory B 35 via the switching means 33, and is also connected to the timer 32. Hence, a description of portions similar to those in the first embodiment will be omitted.

The second embodiment is the same as the first embodiment in that a signal from the shape measuring means 11 is input to the calculation means 31, but differs from the first embodiment in that the calculation means 31 includes a stability determination circuit 36 for determining the stability of the signal.

Since the amount of thermal expansion of the lens 21 (shown in FIGS. 2 and 3) in the shape measuring means 11 is small immediately after the start of exposure, an output signal from the shape measuring means 11 is in some cases unstable. If the stability determination circuit 36 determines that the output signal is sufficiently stable, the calculation means 31 is connected to the memory B 35, in which the previously-measured data representing the relationship between the output signal from the shape measuring means 11 and the amounts of change of the focus position and the imaging magnification of the projection optical system 1 has been stored, by controlling the memory switching means 33, and corrects changes in the focus position and the imaging magnification of the projection optical system 1 in the same manner as in the first embodiment.

If the stability determination circuit 36 determines that the output signal from the shape measuring means 11 is unstable, the calculation means 31 is connected to the memory A 34, in which the previously measured data representing the relationship between the time elapsed after the start of exposure and the amounts of change of the focus position and the imaging magnification of the projection optical system 1 have been stored, by controlling the memory switching means 33, and the calculation means 31 corrects changes in the focus position and the imaging magnification of the projection optical system 1 in accordance with the time elapsed after the start of exposure, which is input from the timer 32. In this case, when the output from the shape measuring means 11 becomes stable, the calculation means 31 is connected to the memory B 35 by controlling the memory switching means 33.

Although in the above-described first and second embodiments a description has been provided of only changes in the focus position and the imaging magnification as examples of changes in the characteristics of the projection optical system 1 due to exposure light, the present invention may also be applied to changes in other characteristics, such as distortion, curvature of field, and the like, of the projection optical system 1.

Although in the first and second embodiments the case in which the present invention is applied to a projection exposure apparatus has been described, the present invention may also be applied to exposure apparatuses of any other types in which a pattern formed on an original is transferred onto another substrate via a projection optical system.

Furthermore, the application of the present invention is not limited to exposure apparatuses, but the present invention may be widely applied to optical apparatuses, each of which includes a projection optical system, such as projectors and the like.

Next, a description will be provided of a further detailed procedure of a semiconductor-device manufacturing method utilizing the above-described exposure apparatus.

Figure 5:
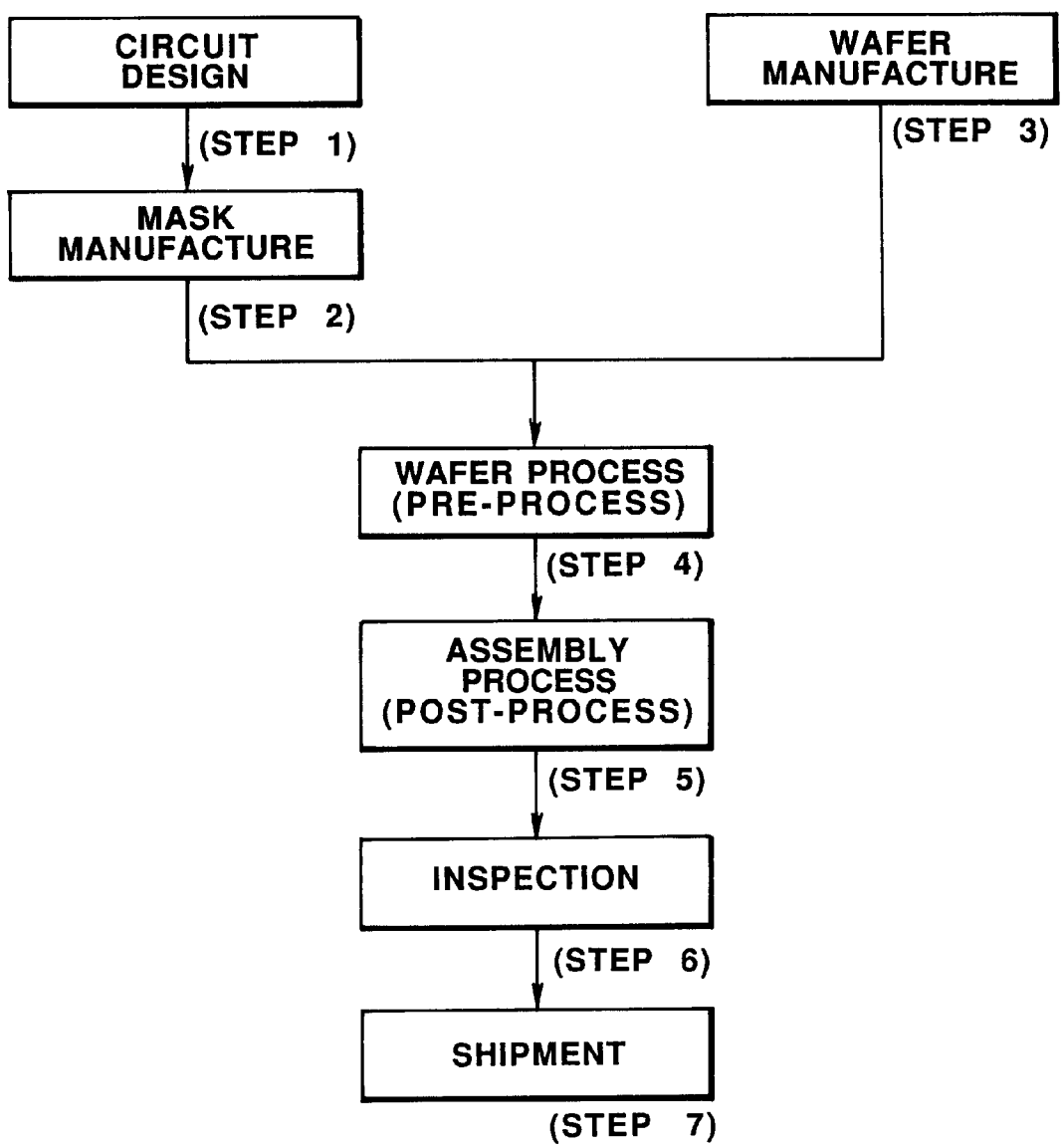
FIG. 5 is a diagram showing a flow for manufacturing semiconductor devices.

FIG. 5 shows a flow for manufacturing semiconductor devices (semiconductor chips of IC's (integrated circuits), LSI's (large-scale integrated circuits) or the like, liquid-crystal panels, CCD's (charge-coupled devices), or the like). In step 1 (circuit design), circuit design of semiconductor devices is performed. In step 2 (mask manufacture), masks on which designed circuit patterns are formed are manufactured. In step 3 (wafer manufacture), wafers are manufactured using a material such as silicon or the like. Step 4 (wafer process) is called a preprocess, in which actual circuits are formed on the wafers by means of photolithography using the above-described masks and wafers. The next step 5 (assembly process) is called a postprocess which manufactures semiconductor chips using the wafers manufactured in step 4, and includes an assembling process (dicing and bonding), a packaging process (chip encapsulation), and the like. In step 6 (inspection), inspection operations, such as operation-confirming tests, durability tests and the like of the semiconductor devices manufactured in step 5, are performed. The manufacture of semiconductor devices is completed after passing through the above-described processes, and the manufactured devices are shipped (step 7).

Figure 6:
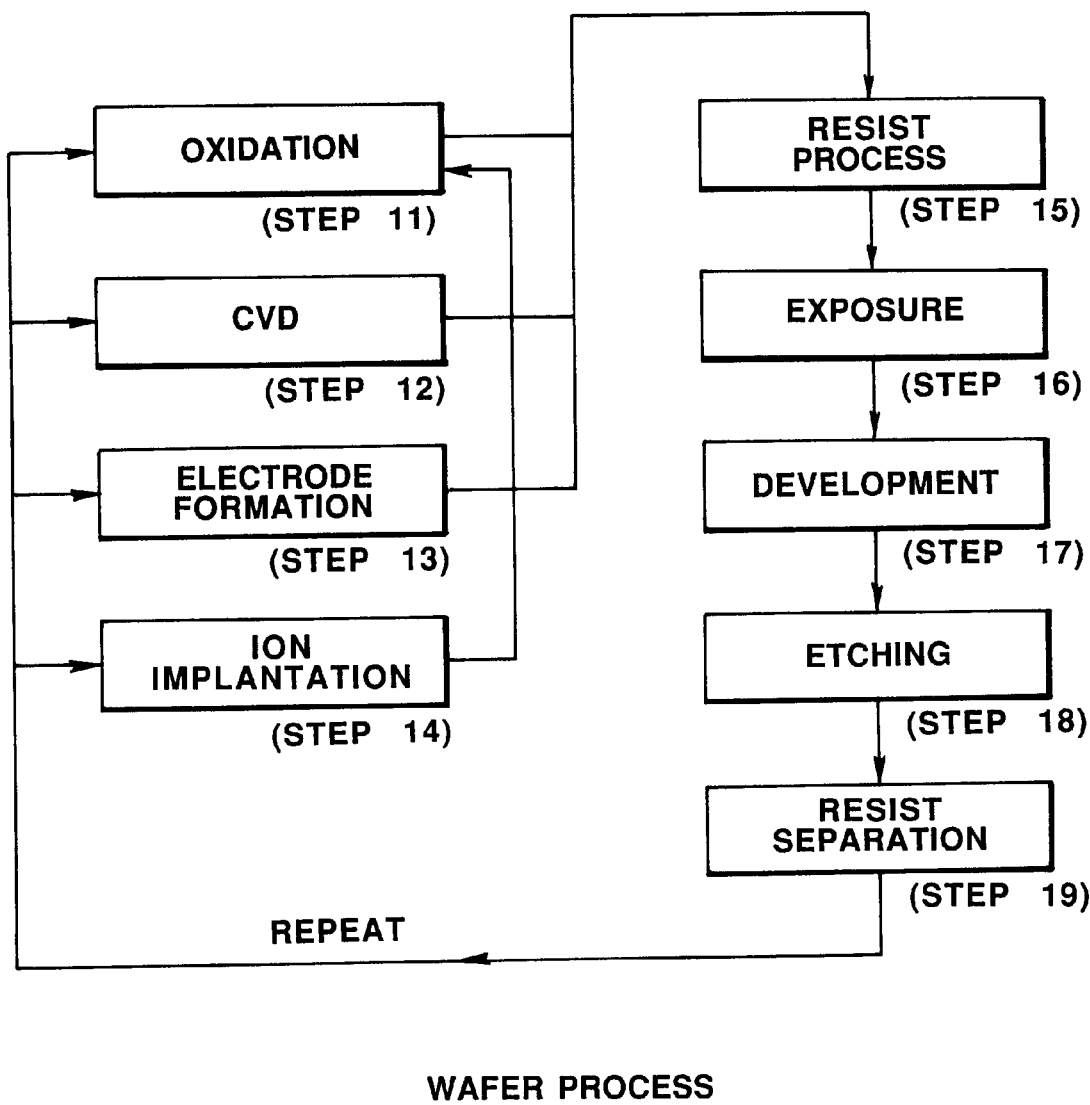
FIG. 6 is a diagram showing a flow for a wafer process.
Figure 7:
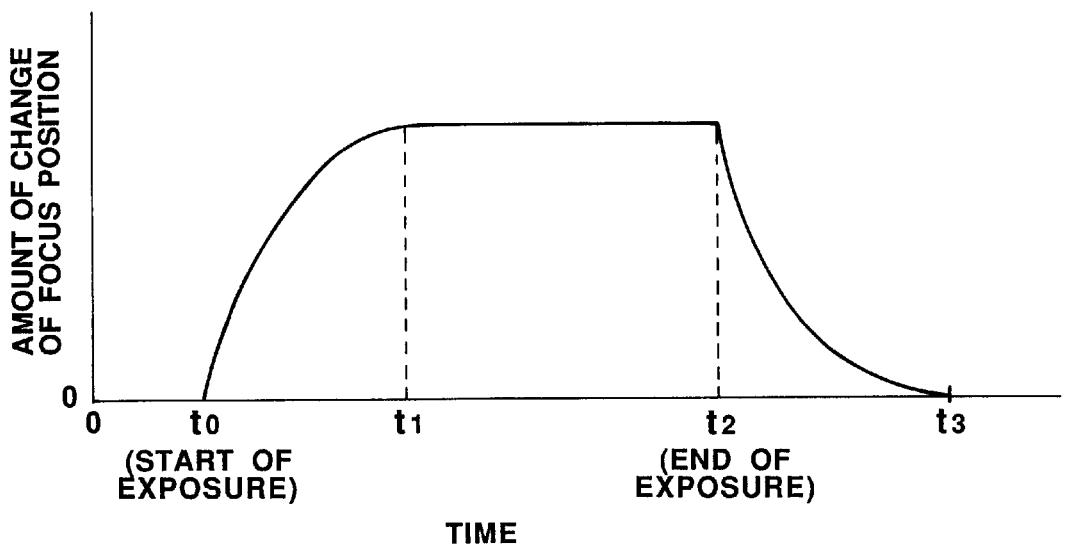
FIG. 7 is a diagram illustrating a change in time of the amount of change of the focus position of a conventional projection optical system.
Figure 8:
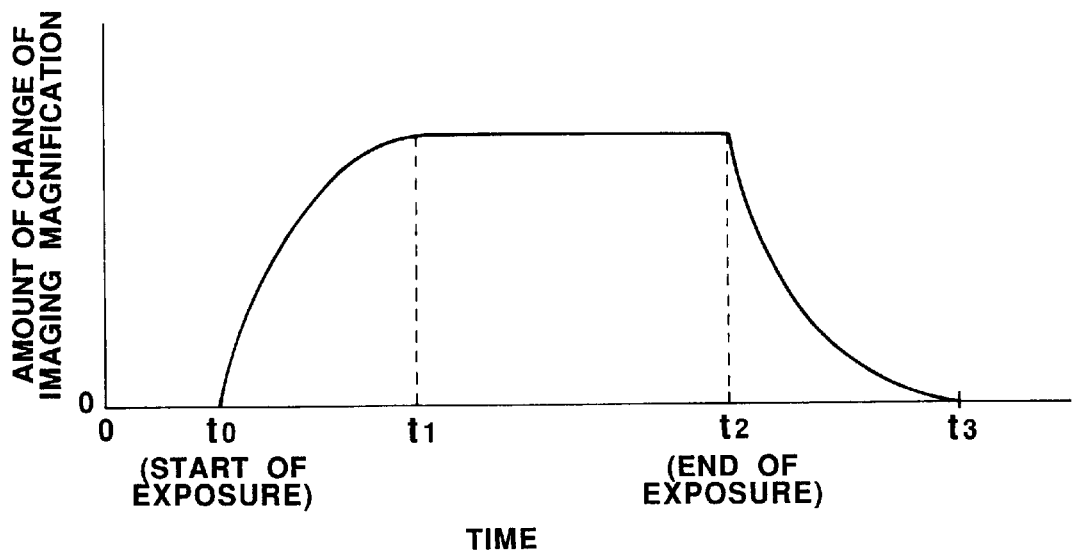
FIG. 8 is a diagram showing a change in time of the amount of change of the imaging magnification of the conventional projection optical system.
Figure 9:
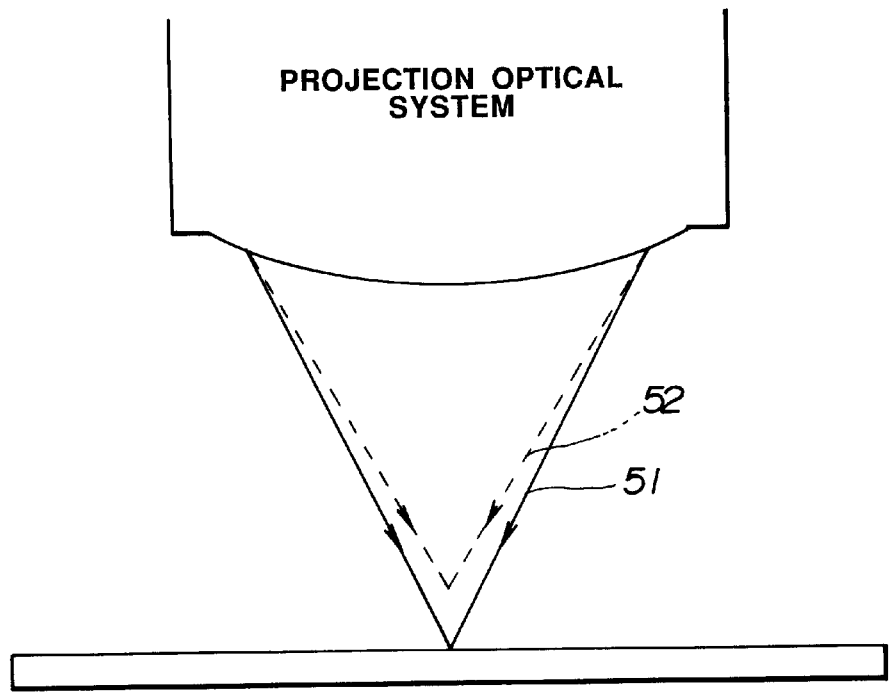
FIG. 9 is a diagram illustrating a change in the focus position of the conventional projection optical system.
Figure 10:
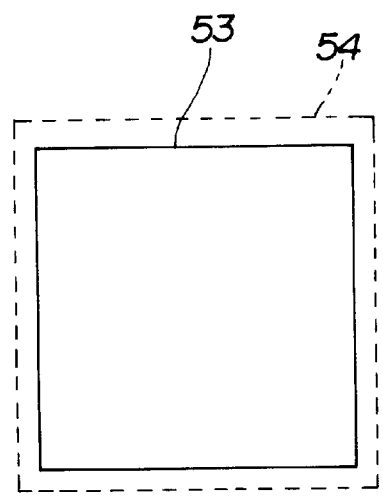
FIG. 10 is a diagram illustrating a change in the imaging magnification of the conventional projection optical system.

FIG. 6 shows the detailed flow of the above-described wafer process. In step 11 (oxidation), the surface of the wafer is oxidized. In step 12 (CVD), an insulating film is formed on the surface of the wafer. In step 13 (electrode formation), electrodes are formed on the surface of the wafer by vacuum deposition. In step 14 (ion implantation), ions are implanted into the wafer. In step 15 (resist process), a photosensitive material is coated on the wafer. In step 16 (exposure), the circuit pattern on the mask is exposed and printed on the wafer by the above-described x-ray exposure apparatus. In step 17 (development), the exposed wafer is developed. In step 18 (etching), portions other than the developed resist image are etched off. In step 19 (resist separation), the resist which becomes unnecessary after the completion of the etching is removed. By repeating these steps, a final circuit pattern made of multiple patterns is formed on the wafer.

By using the manufacturing method of the present embodiment, it is possible to manufacture semiconductor devices with a high degree of integration, which have previously been difficult to manufacture.

The individual components shown in outline or designated by blocks in the drawings are all well-known in the projection optical system arts and their specific construction and operation are not critical to the operation or best mode for carrying out the invention.

While the present invention has been described with respect to what is now considered to be the preferred embodiments, it is to be understood that the invention is not limited to the disclosed embodiments. To the contrary, the invention is intended to cover various modifications and equivalent arrangements included within the spirit and scope of the following claims. Therefore, the claims are to be accorded the broadest interpretation so as to encompass all such modifications and equivalent structures and functions.

What is claimed is:

1. A projection optical apparatus, comprising:
   a projection optical system, having an adjustable optical characteristic, for projecting a pattern with light, said projection optical system comprising an optical element through which the light is transmitted, said optical element having a diameter that changes due to a thermal change in said optical element caused by the light being transmitted therethrough by said projection optical system;
   measurement means for measuring, directly from said optical element. information corresponding to a change in the diameter of said optical element and outputting a signal corresponding to the measured change; and
   adjustment means for receiving the signal from said measurement means and adjusting the optical characteristic of said projection optical system in accordance with the signal from said measurement means.

2. An apparatus according to claim 1, wherein said adjustment means comprises means for adjusting a focus position of said projection optical system.

3. An apparatus according to claim 1, wherein said adjustment means comprises means for adjusting an imaging magnification of said projection optical system.

4. An apparatus according to claim 1, wherein said adjustment means comprises stability determination means for determining whether the signal from said measurement means is stable or unstable.

5. An apparatus according to claim 1, wherein said adjustment means comprises:
   timer means for outputting a time signal corresponding to the amount of time elapsed from the start of an exposure operation; and memory means for storing previously determined data representing a relationship between a change in the optical characteristic of said projection optical system and the amount of time elapsed from the start of an exposure operation, wherein said adjustment means performs adjustment of the optical characteristic using the time signal from said timer means and the data stored in said memory means.

6. An apparatus according to claim 1, wherein said adjustment means comprises first memory means for storing previously determined data representing a relationship between changes in the lens shape and a change in the optical characteristic of said projection optical system, and means for performing the adjustment of the optical characteristic using the signal from said measurement means and the data stored in said first memory means.

7. An apparatus according to claim 6, wherein said adjustment means further comprises:

timer means for outputting a time signal corresponding to the amount of time elapsed from the start of an exposure operation;

second memory means for storing previously determined data representing a relationship between a change in the optical characteristic of said projection optical system and the amount of time elapsed from the start of an exposure operation; and switching means for selecting one of a first type of adjustment operation and a second type of adjustment operation, wherein said adjustment means performs adjustment of the optical characteristic using the signal from said measurement means and the data stored in said first memory means when the first type of adjustment operation is selected, and performs adjustment using the time signal from said timer means and the data stored in said second memory means when the second type of adjustment operation is selected.

8. An apparatus according to claim 7, wherein said adjustment means further comprises:

stability determination means for determining whether the signal from said measurement means is stable or unstable, and for controlling said switching means in accordance with the determination, wherein said switching means selects the first type of adjustment operation when the signal from said measurement means is stable and selects the second type of adjustment operation when the signal from said measurement means is unstable.

9. An apparatus according to claim 1, wherein said measurement means comprises means for measuring a change in the shape of the optical member due to a thermal change.

10. An apparatus according to claim 1, wherein said measurement means comprises pressure sensor means for measuring a change in the shape of the optical member due to a change in pressure.

11. An apparatus according to claim 10, wherein said measurement means further comprises sensor adjusting means for adjusting the position of the pressure sensor means.

12. A projection exposure apparatus for transferring a pattern on an original onto a substrate, said projection exposure apparatus comprising:

exposure means for exposing the pattern on the original with exposure light;

a projection optical system for projecting the exposed pattern on the original onto the substrate with light, to expose and transfer the pattern onto the substrate, said projection optical system having an adjustable optical characteristic and comprising an optical element through which the light is transmitted, and said optical element having a diameter that changes due to a thermal change in said optical element caused by the light being transmitted therethrough by said projection optical system;

measurement means for measuring, directly from said optical element, information corresponding to a change in the diameter of said optical element and outputting a signal corresponding to the measured change; and adjustment means for receiving the signal from said measurement means and adjusting the optical characteristic of said projection optical system in accordance with the signal from said measurement means.

13. An apparatus according to claim 12, wherein said exposure means comprises means for exposing a circuit pattern of a semiconductor device and said projection optical system comprises means for projecting the exposed circuit pattern onto the substrate.

14. An apparatus according to claim 12, wherein said adjustment means comprises first memory means for storing previously measured data representing a relationship between changes in the lens shape and a change in the optical characteristics of said projection optical system, and means for performing the adjustment of the optical characteristic using the signal from said measurement means and the data stored in said first memory means.

15. An apparatus according to claim 14, wherein said adjustment means further comprises:

timer means for outputting a time signal corresponding to the amount of time elapsed from the start of an exposure operation;

second memory means for storing previously measured data representing a relationship between a change in the optical characteristic of said projection optical system and the amount of time elapsed from the start of an exposure operation; and switching means for selecting one of a first type of adjustment operation and a second type of adjustment operation, wherein said adjustment means performs adjustment of the optical characteristic using the signal from said measurement means and the data stored in said first memory means when the first type of adjustment operation is selected, and performs adjustment using the time signal from said timer means and the data stored in said second memory means when the second type of adjustment operation is selected.

16. An apparatus according to claim 15, wherein said adjustment means further comprises stability determination means for determining whether the signal from said measurement means is stable or unstable, and controlling said switching means in accordance with the determination, wherein said switching means selects the first type of adjustment operation when the signal from said measurement means is stable and selects the second type of adjustment operation when the signal from said measurement means is unstable.

17. A method of manufacturing devices using a wafer and a reticle having a circuit pattern, said method comprising the steps of:

exposing and transferring the circuit pattern on the reticle onto the wafer by projecting the circuit pattern onto the wafer with light using a projection optical system having an adjustable optical characteristic and comprising an optical element through which the light is transmitted, said optical element having a diameter that changes due to a thermal change in said optical element caused by the light being transmitted therethrough by said projection optical system;

measuring, directly from said optical element, information corresponding to a change in the diameter of the optical element and outputting a signal corresponding to the measured change; and adjusting the optical characteristic of the projection optical system in accordance with the signal resulting from said measuring step.

18. A method according to claim 17, further comprising:

storing data representing a relationship between a change in the shape of the optical member and a change in the optical characteristic of the projection optical system, wherein said adjusting step further comprises adjusting the optical characteristic in accordance with the stored data and the signal output in said measuring step.

19. A method according to claim 17, wherein said adjusting step further comprises:

determining whether the signal resulting from said measuring step is stable or unstable; and selecting a basis for performing the adjustment of the optical characteristic in accordance with a result of said determining step.

20. A method according to claim 19, wherein said selecting step comprises:

selecting a first basis for performing said adjusting when the signal is stable and selecting a second basis for performing said adjusting when the signal is unstable, wherein the first basis includes using the signal from said measuring step and previously stored data representing a relationship between a change in the optical member shape and a change in the optical characteristic of the projection optical system, and the selected second basis includes using a timing signal representing an amount of time elapsed since the beginning of an exposure operation and previously stored data representing a relationship between the amount of time elapsed since the beginning of an exposure operation and a change in the optical characteristic of the projection optical system.

21. An apparatus according to claim 1, wherein said measurement means comprises a plurality of pressure sensors disposed near said projection optical system.

22. An exposure apparatus according to claim 12, wherein said measurement means comprises a plurality of pressure sensors disposed near said projection optical system.

23. A projection optical apparatus, comprising:

a projection optical system for projecting a pattern with light, said projection optical system comprising an optical element through which the light is transmitted, said optical element having a diameter that changes due to a thermal change in said optical element caused by the light being transmitted therethrough by said projection optical system;

detecting means for detecting, directly from said optical element, information corresponding to a change in the diameter of said optical element and for outputting a signal indicative thereof; and adjustment means for adjusting an optical characteristic of said projection optical system in accordance with the detected change.

24. An apparatus according to claim 23, wherein said adjustment means comprises means for adjusting a focus position of said projection optical system.

25. An apparatus according to claim 23, wherein said adjustment means comprises means for adjusting an imaging magnification of said projection optical system.

26. An apparatus according to claim 23, wherein said adjustment means comprises stability determining means for determining whether the signal from said detecting means is stable.

27. An apparatus according to claim 23, wherein said adjustment means comprises:

timer means for outputting a time signal corresponding to the amount of time elapsed from the start of an exposure operation; and memory means for storing previously determined data representing a relationship between a change in the optical characteristic of said projection optical system and the amount of time elapsed from the start of an exposure operation, wherein said adjustment means adjusts the optical characteristic using the time signal from said timer means and the data stored in said memory means.

28. An apparatus according to claim 23, wherein said adjustment means comprises (i) first memory means for storing previously determined data representing a relationship between a change in the volume of said optical member and changes in the optical characteristic of said projection optical system, and (ii) means for adjusting the optical characteristic using the signal from said detecting means and the data stored in said first memory means.

29. An apparatus according to claim 28, wherein said adjustment means further comprises:

timer means for outputting a time signal corresponding to the amount of time elapsed from the start of an exposure operation;

second memory means for storing previously determined data representing a relationship between a change in the optical characteristic of said projection optical system and the amount of time elapsed from the start of an exposure operation; and switching means for selecting one of a first type of adjustment operation and a second type of adjustment operation, wherein said adjustment means adjusts the optical characteristic using the signal from said detecting means and the data stored in said first memory means when the first type of adjustment operation is selected, and adjusts the optical characteristic using the time signal from said timer means and the data stored in said second memory means when the second type of adjustment operation is selected.

30. An apparatus according to claim 29, wherein said adjustment means further comprises:

stability determining means for determining whether the signal from said detecting means is stable, and for controlling said switching means in accordance with the determination, wherein said switching means selects the first type of adjustment operation when the signal from said detecting means is stable and selects the second type of adjustment operation when the signal from said detecting means is unstable.

31. An apparatus according to claim 23, wherein said detecting means comprises means for measuring a change in the volume of said optical member due to a thermal change.

32. An apparatus according to claim 23, wherein said detecting means comprises pressure sensor means for measuring a change in the volume of said optical member due to a change in pressure.

33. An apparatus according to claim 32, wherein said detecting means further comprises sensor adjusting means for adjusting the position of said pressure sensor means.

34. A projection exposure apparatus for transferring a pattern on an original onto a substrate, said projection exposure apparatus comprising:

exposure means for exposing the pattern on the original with exposure light;

a projection optical system for projecting the exposed pattern on the original onto the substrate with light to expose and transfer the pattern onto the substrate, said projection optical system comprising an optical element through which the light is transmitted, said optical element having a diameter that changes due to a thermal change in said optical element caused by the light being transmitted therethrough by said projection optical system;

detecting means for detecting, directly from said optical element, information corresponding to a change in the diameter of said optical element and for outputting a signal indicative thereof; and adjustment means for adjusting an optical characteristic of said projection optical system in accordance with the detected change.

35. An apparatus according to claim 34, wherein said exposure means comprises means for exposing a circuit pattern of a semiconductor device and said projection optical system comprises means for projecting the exposed circuit pattern onto the substrate.

36. An apparatus according to claim 34, wherein said adjustment means comprises (i) first memory means for storing previously measured data representing a relationship between changes in the volume of said optical member and changes in the optical characteristic of said projection optical system, and (ii) means for adjusting the optical characteristic using the signal from said detecting means and the data stored in said first memory means.

37. An apparatus according to claim 36, wherein said adjustment means further comprises:

timer means for outputting a time signal corresponding to the amount of time elapsed from the start of an exposure operation;

second memory means for storing previously measured data representing a relationship between a change in the optical characteristic of said projection optical system and the amount of time elapsed from the start of an exposure operation; and switching means for selecting one of a first type of adjustment operation and a second type of adjustment operation, wherein said adjustment means adjusts the optical characteristic using the signal from said detecting means and the data stored in said first memory means when the first type of adjustment operation is selected, and adjusts the optical characteristic using the time signal from said timer means and the data stored in said second memory means when the second type of adjustment operation is selected.

38. An apparatus according to claim 37, wherein said adjustment means further comprises stability determination means for determining whether the signal from said detecting means is stable, and for controlling said switching means in accordance with the determination, wherein said switching means selects the first type of adjustment operation when the signal from said detecting means is stable and selects the second type of adjustment operation when the signal from said detecting means is unstable.

39. A method of manufacturing devices using a wafer and a reticle having a circuit pattern, said method comprising the steps of:

exposing and transferring the circuit pattern on the reticle onto the wafer by projecting the circuit pattern onto the wafer with light using a projection optical system including an optical element through which the light is transmitted, said optical element having a diameter that changes due to a thermal change in said optical element caused by the light being transmitted therethrough by said projection optical system;

detecting, directly from said optical element, information corresponding to a change in the diameter of the optical element and outputting a signal indicative thereof; and adjusting an optical characteristic of the projection optical system based on the output from said detecting step.

40. A method according to claim 39, further comprising:

storing data representing a relationship between a change in the volume of the optical member and a change in the optical characteristic of the projection optical system, wherein said adjusting step further comprises adjusting the optical characteristic in accordance with the stored data and the output from said detecting step.

41. A method according to claim 39, wherein said adjusting step further comprises:

determining whether the signal resulting from said detecting step is stable; and selecting a basis for adjusting the optical characteristic in accordance with a result of said determining step.

42. A method according to claim 41, wherein said selecting step comprises:

selecting a first basis for performing said adjusting when the signal is stable and selecting a second basis for performing said adjusting when the signal is unstable, wherein the first basis includes using the signal from said detecting step and previously stored data representing a relationship between a change in the volume of the optical member and a change in the optical characteristic of the projection optical system, and the second basis includes using a timing signal representing an amount of time elapsed since the beginning of an exposure operation and previously stored data representing a relationship between the amount of time elapsed since the beginning of an exposure operation and a change in the optical characteristic of the projection optical system.

43. An apparatus according to claim 1, wherein said optical member consists of a lens.

44. An apparatus according to claim 1, wherein said optical member consists of a plane parallel plate.

45. An apparatus according to claim 12, wherein said optical member consists of a lens.

46. An apparatus according to claim 12, wherein said optical member consists of a plane parallel plate.

47. An apparatus according to claim 23, wherein said optical member consists of a lens.

48. An apparatus according to claim 23, wherein said optical member consists of a plane parallel plate.

49. An apparatus according to claim 34, wherein said optical member consists of a lens.

50. An apparatus according to claim 34, wherein said optical member consists of a plane parallel plate.

51. An apparatus according to claim 24, wherein said focus position adjusting means comprises moving means for moving a substrate, on which the pattern is projected with the light, in a direction of an optical axis of said projection optical system.

52. An apparatus according to claim 25, wherein said imaging magnification adjusting means comprises changing means for changing pressure in a space between lenses of said projection optical system.

53. A projection optical apparatus comprising:

a projection optical system for projecting a pattern with light, said projection optical system comprising an optical element on which the light is irradiated, said optical element having a diameter that changes due to a thermal change in said optical element;

detecting means for detecting, directly from said optical element, information corresponding to a change in the diameter of said optical element; and adjustment means for adjusting said apparatus in accordance with the detected change.

54. A projection exposure apparatus for transferring a pattern on an original onto a substrate, said projection exposure apparatus comprising:

exposure means for exposing the pattern on the original with exposure light;

a projection optical system for projecting the exposed pattern on the original onto the substrate with light to expose and transfer the pattern onto the substrate, said projection optical system comprising an optical element on which the light is irradiated, said optical element having a diameter that changes due to a thermal change in said optical element;

detecting means for detecting, directly from said optical element, information corresponding to a change in the diameter of said optical element and for outputting a signal indicative thereof; and adjustment means for adjusting said apparatus in accordance with the detected change.

55. A method of manufacturing devices using a wafer and a reticle having a circuit pattern, said method comprising the steps of:

exposing and transferring the circuit pattern on the reticle onto the wafer by projecting the circuit pattern onto the wafer with light using a projection optical system including an optical element on which the light is irradiated, the optical element having a diameter that changes due to a thermal change;

detecting, directly from the optical element, information corresponding to a change in the diameter of the optical element; and adjusting an optical characteristic of the projection optical system based on the detection in said detecting step.

56. A method of manufacturing devices using a wafer and a reticle having a circuit pattern, said method comprising the steps of:

exposing and transferring the circuit pattern on the reticle onto the wafer with light using a projection optical system that includes an optical element on which the light is irradiated, the optical element having a diameter that changes due to a thermal change;

detecting, directly from the optical element, information corresponding to a change in the diameter of the optical element; and adjusting a distance between an imaging position of the circuit pattern and the wafer, based on the detection in said detecting step.

* * * * *

UNITED STATES PATENT AND TRADEMARK OFFICE
CERTIFICATE OF CORRECTION

PATENT NO. : 5,953,106

DATED : September 14, 1999

INVENTOR(S): YASUYUKI UNNO, ET AL.

It is certified that error appears in the above-identified patent and that said Letters Patent is hereby corrected as shown below:

COLUMN 10:
Line 26, "is" should read --are--; and
Line 45, "element." should read --element,--.

COLUMN 11:
Line 11, "changes" should read --a change--.

COLUMN 12:
Line 25, "changes" should read --a change--, and "a change" should read --changes--.

COLUMN 14:
Line 28, "changes" should read --a change--.

Signed and Sealed this

Thirtieth Day of May, 2000

Attest:

Q. TODD DICKINSON

*Attesting Officer*     *Director of Patents and Trademarks*